US008772713B1

(12) United States Patent
Moon et al.

(10) Patent No.: US 8,772,713 B1

(45) Date of Patent: Jul. 8, 2014

(54) FLIGHT TIME BASED MASS MICROSCOPE SYSTEM FOR ULTRA HIGH-SPEED MULTI MODE MASS ANALYSIS

(75) Inventors: Jeong Hee Moon, Goyang-si (KR); Dae Won Moon, Daejeon (KR); Tae Geol Lee, Daejeon (KR); Sohee Yoon, Guri-si (KR); Ju Hwang Kim, Daejeon (KR)

(73) Assignee: Korea Research Institute of Standards and Science (KR)

( * ) Notice: Subject to any disclaimer, the term of this patent is extended or adjusted under 35 U.S.C. 154(b) by 0 days.

(21) Appl. No.: 14/117,116

(22) PCT Filed: May 3, 2012

(86) PCT No.: PCT/KR2012/003463

§ 371 (c)(1), (2), (4) Date: Nov. 26, 2013

(87) PCT Pub. No.: WO2012/157867

PCT Pub. Date: Nov. 22, 2012

(30) Foreign Application Priority Data

May 13, 2011 (KR) ........................ 10-2011-0045281

(51) Int. Cl.

*H01J 49/40* (2006.01)
*H01J 37/26* (2006.01)
*H01J 37/28* (2006.01)
*B01D 59/44* (2006.01)
*H01J 49/00* (2006.01)

(52) U.S. Cl.

CPC ............. *H01J 49/0004* (2013.01); *H01J 49/40* (2013.01); *H01J 49/406* (2013.01)

USPC ............ 250/309; 250/287; 250/281; 250/282

(58) Field of Classification Search

USPC ......... 250/281, 282, 286–288, 299, 306, 307, 250/309, 423 R, 424, 423 P, 492.21, 492.3, 250/526

See application file for complete search history.

(56) References Cited

U.S. PATENT DOCUMENTS 5,315,113 A * 5/1994 Larson et al. ................. 250/305
5,365,063 A 11/1994 Kaesdorf et al.
6,288,394 B1 * 9/2001 Barnes et al. ................... 850/43
7,501,620 B2 3/2009 Ogawa et al.

(Continued)

FOREIGN PATENT DOCUMENTS

JP 2007066533 3/2007

OTHER PUBLICATIONS

International Search Report—PCT/KR2012/003463 dated Nov. 21, 2012.

(Continued)

*Primary Examiner* — Bernard E Souw

(74) *Attorney, Agent, or Firm* — Cantor Colburn LLP

(57) ABSTRACT

The present invention aims to provide a time-of-flight based mass microscope system for an ultra-high speed multi-mode mass analysis, for using a laser beam or an ion beam simultaneously to enable both a low molecular weight analysis such as for drugs/metabolome/lipids/peptides and a high molecular weight analysis such as for genes/proteins, without being limited by the molecular weight of the object being analyzed, and for significantly increasing the measuring speed by using a microscope method instead of a microprobe method.

15 Claims, 14 Drawing Sheets

(56) References Cited

U.S. PATENT DOCUMENTS

| | | | | |
|---|---|---|---|---|
| 7,629,576 | B2 * | 12/2009 | Schultz et al. | 250/287 |
| 8,280,664 | B2 * | 10/2012 | Kimba et al. | 702/95 |
| 2006/0138317 | A1 * | 6/2006 | Schultz et al. | 250/287 |
| 2009/0189072 | A1 * | 7/2009 | Egan et al. | 250/287 |
| 2009/0309017 | A1 * | 12/2009 | Yamaguchi | 250/282 |
| 2011/0147578 | A1 * | 6/2011 | Schultz et al. | 250/282 |

OTHER PUBLICATIONS

Kenneth H. Buetow et al., High-throughput development and characterization of a genomewide collection of gene-based single nucleotide polymorphism markers by chip-based matrix-assisted laser desorption/ionization time-of-flight mass spectrometry, PNAS, 2001, pp. 581-584.

* cited by examiner

FLIGHT TIME BASED MASS MICROSCOPE SYSTEM FOR ULTRA HIGH-SPEED MULTI MODE MASS ANALYSIS

TECHNICAL FIELD

The present invention relates to a time-of-flight (TOF) based mass microscope system for an ultra-high speed multi-mode mass analysis.

Most mass spectrometer [MALDI-TOF and time-of flight secondary ion mass spectroscopy (TOF-SIMS)] using a mass analysis method based on a time-of-flight (TOF) have been currently used in a microprobe mode at the time of analyzing a sample surface. However, as technologies in various fields are rapidly developed, limitation in a subject to be analyzed in the mass spectrometer or limitation in an analysis speed is a setback for a study. That is, a mass spectrometer capable of currently achieving a wide range of analysis from a low molecular weight mass analysis such as a drug to a high molecular weight mass analysis such as proteins and simultaneously and rapidly measuring by 100 times or more as compared to existing mass analysis devices has been demanded.

A detailed description thereof will be provided below. A digitalized molecular diagnosis mass analysis system for achieving diagnosis of objective and quantitative diseases and realization of personalized medicine by measuring the sample as it is, escaping from a micro-array typed biochip diagnosis using intensity of a fluorescent label or a biopsy tissue shape measurement and analysis by staining (H & E) or using an electron beam (Bio-SEM/TEM) has been demanded. In particular, in order to be used in a hospital or a health examination center rather than for a research and development (R&D) research, a high-throughput mass microscope system for a molecular analysis in which a measuring speed thereof is increased by at least 100 times more than that of the existing mass analysis system has been demanded by a person skilled in the art.

In addition to the increased measuring speed as compared to the existing mass spectrometer, in order to achieve early stage diagnosis of chronic and neoplastic diseases and realization of personalized medicine, a multi-mode mass analysis platform technology capable of substantially measuring all materials rather than measuring only some part of the materials such as drugs, metabolome, lipids, and peptides is required. Further, a high-throughput mass chemistry microscope platform technology capable of measuring various samples such as a large area plate, a micro-array chip, a biopsy tissue, and the like, at an ultra-high speed without limitation of a size or a kind of sample is required.

That is, a need for a multi-mode high-throughput mass analysis has become increased in order to discover key diagnostic markers of drugs, metabolome, lipids, and proteins related to the diseases for achieving early stage diagnosis of the chronic and neoplastic diseases and the realization of the individually personalized diagnosis and treatment has become increased.

BACKGROUND ART

At the Korea Research Institute of Standards and Science, a microprobe mode (spatial resolution: micron level and low-throughput) laser based matrix-assisted laser desorption/ionization-time of flight (MALDI-TOF) imaging equipment (previously filed and registered as a patent) rather than a microscope mode was manufactured and used together with a microprobe mode (spatial resolution: a 100 nm and low-throughput) time-of-flight secondary ion mass spectroscopy (TOF-SIMS) imaging equipment coupled with a cluster ion beam, such that research into a possibility for achieving early stage diagnosis of diseases and realization of personalized medicine diagnosis through mass imaging of a biological tissue has been conducted in collaboration with Seoul National University Hospital, National Cancer Center, Dong-A University Hospital, Yonsei University Health System, Samsung Hospital, and the like. In addition, research into development of new medicine and diagnosis has been conducted by searching and discovering metabolome (GC-MS), genes, and proteins (MALDI-TOF) related markers using various mass analyzing conventional equipment from foreign companies in a number of national research and development (R&D) business including a proteomics utilizing technology development business (21C frontier research development business). As described above, at the Korea Research Institute of Standards and Science, the microprobe mode MALDI imaging equipment having a micron level of spatial resolution (hereinafter, referred to as Prior Art 1) was manufactured and applied to an mass imaging of various bio samples; however, the equipment has a low-throughput having a limitation in a measuring speed as described in the above description, which may be possibly be utilized at a R&D research facility rather than in a hospital or a health examination center.

Further, German Cancer Research Center and Arlinghaus professor group of Munster University use an ion beam based TOF-SIMS imaging technology for PNA-DNA microarray imaging and research into a technology of removing cancer cell by a boron neutron capture therapy (BNCT). In addition, at the Korea Research Institute of Standards and Science, a cluster ion beam based TOF-SIMS imaging technology was used to research human skin, retina, heart, cardiovascular, colon tissues and body samples (serum, stool, and the like) provided from Seoul National University Hospital (ophthalmology, dermatology), Yonsei University Health System, Samsung Hospital, and National Cancer Center, such that disease research at metabolome and lipids level, diagnosis, a difference between individual chemotherapy and chemoradiation have been researched (hereinafter, referred to as Prior Art 2). However, the above-mentioned technologies still have a low-throughput due to limitation in the measuring speed since an imaging measurement is performed in a microprobe mode).

US Sequenom Inc. performed a large scaled single nucleotide polymorphism (SNP) research in collaboration with National Cancer Institute (NCI) in 2001 and published a paper ""High Throughput Development and Characterization of a Genome-Wide Collection of Gene-Based SNP Markers by chip-based MALDI-TOF" (hereinafter, referred to as Prior Art 3) in Proceedings of the National Academy of Sciences (PNAS). In Prior Art 3, an automatic analysis method and a MassARRAY system by Sequenom were used and analysis was performed 9,000 or more times on 94 people to successively find 3,148 SNPs, which were not known until now. Through this research, it may be considered that automation of SNP analysis is capable of being achieved and SNP for a number of people is capable of being analyzed in one reaction by treating a DNA sample together.

In addition, Heeren professor group of Netherlands FOM institute developed a novel microscope mode MALDI imaging equipment and secured a micron level of spatial resolution imaging technology (hereinafter, referred to as Prior Art 4). Further, in accordance with global trend of drug discovery, disease diagnosis, and biomarker discovery research by the mass imaging of the biotissue, imaging MALDI mass spectrometers have been released by world's leading mass spectrometer companies such as US Applied Biosystems, Waters and German Bruker-Daltonics since 2000.

However, the above-described equipments according to the Prior Arts or the MALDI imaging research currently conducted by world's leading research groups (including US Caprioli, and the like) and national research groups (including Konkuk University) has actual spatial resolution of merely about 30 to 50 μm or does not still overcome the limitation in the measuring speed. Information capable of being obtained by the spatial resolution is merely for direct profiling from the tissue rather than an imaging grade, and therefore, in order to achieve a minimal and meaningful imaging, securing the micro level of the spatial resolution is urgently required.

FIG. 1 shows differences between a microprobe mode and a microscope mode. In order to obtain a mass chemistry imaging or a mass spectrum in both of a laser based MALDI-TOF or an ion beam based TOF-SIMS as which are commercially available in the spectrometer market as conventional equipment from both of the inside and outside of the country, data may be obtained by scanning a sample surface in the microprobe mode with pixel-by-pixel (for example, 256×256) (see FIG. 1). Therefore, since the measuring speed (1 sample/sec for MALDI-TOF, 0.01 sample/sec for TOF-SIMS) is too low to be used in hospital or a medical diagnostic system for health examination, the above-described equipment are merely used in R&D research but the utilization range thereof has a limitation. In the above-described Prior Art 4, a micro level of spatial resolution imaging technology was secured and various technologies were introduced in order to increase the measuring speed; however, as shown in FIG. 1, since position sensitive detector (x, y) & mass gating (Δt) was used, mass range should be selected, such that a problem that mass analysis of an unknown sample is not capable of being performed still needs to be solved.

In addition, according to the above-described Prior Arts, molecules having a wide range of mass from low molecular weight to high molecular weight are not capable of being measured by one medical diagnostic equipment. Since it is difficult to measure low molecular weight molecules such as drugs, metabolome, and the like, due to a matrix interference causing MALDI, the laser based MALDI-TOF has been mainly used for measuring high molecular weight molecules such as genes, proteins, and the like, and the ion beam based TOF-SIMS having a low sensitivity of the high molecular weight molecule has been used for measuring the low molecular weight molecules such as drugs, metabolome, and the like. Therefore, measuring equipment needs to be changed depending on molecular weight, which is inconvenient for measuring work, and equipment purchasing cost becomes increased.

Technical Problem

An embodiment of the present invention is directed to providing a time-of-flight (TOF) based mass microscope system for an ultra-high speed multi-mode mass analysis, for using a laser beam or an ion beam simultaneously to enable both a low molecular weight analysis such as for drugs/metabolome/lipids/peptides and a high molecular weight analysis such as for genes/proteins, without being limited by the molecular weight of an object being analyzed, and for significantly increasing a measuring speed by using a microscope method instead of a microprobe method.

Technical Solution

In one general aspect, there is provided a time-of-flight (TOF) based mass microscope system 100 for an ultra-high speed multi-mode mass analysis, the time-of-flight based mass microscope system performing a mass imaging analysis of a sample in a microscope mode by irradiating a laser beam, an ion beam, or any one of the laser beam and the ion beam in a defocused state on the sample, photographing an image of the sample, and simultaneously measuring and detecting a position of a secondary ion generated from the sample at the time of irradiating the laser beam or the ion beam, based on a time-of-flight (TOF), so as to perform the analysis with respect to all samples having from a low molecular weight sample to a high molecular weight sample.

The high molecular weight sample may be at least any one selected from genes, proteins, and polymers. In addition, the low molecular weight sample may be at least any one selected from drugs, metabolome, lipids, and peptides.

The position of the secondary ion may be detected by using a matrix-assisted laser desorption/ionization-time of flight (MALDI-TOF) scheme at the time of irradiating the laser beam. Otherwise, the position of the secondary ion may be detected by using a time-of-flight secondary ion mass spectroscopy (TOF-SIMS) scheme at the time of irradiating the ion beam.

A simultaneous detector for time and position including a delay-line detector may be used in order to measure the position of the secondary ion generated from the sample.

At the time of measuring the position of the secondary ion generated from the sample, both of a linear scheme and a reflectron scheme may be used.

The mass microscope system 100 may include a laser input 110 irradiating a laser beam on a sample; an ion gun assembly 120 irradiating an ion beam on a sample; a sample inlet chamber 130 into which the sample is input by a sample input part 131; a sample plate 140 in which the sample is disposed; a sample plate manipulator 150 controlling a position of the sample plate 140; a charge-coupled device (CCD) camera 160 photographing an image of the sample; a source lens assembly 170 controlling a focus of the laser beam or the ion beam irradiated to the sample; and a position sensitive time of-flight (TOF) detector measuring the position of the secondary ion generated from the sample. The position sensitive TOF detector may include a linear mode position sensitive TOF detector 180 measuring the position of the secondary ion generated from the sample in a linear scheme; and a reflectron mode position sensitive TOF detector 190 measuring the position of the secondary ion generated from the sample in a reflectron scheme.

The mass microscope system 100 may include an ion optics assembly 50 collecting the secondary ions so that the secondary ions generated by the laser beam or the ion beam irradiated to the sample are smoothly detected. The position sensitive TOF detector may include the ion optics assembly 50.

The ion optics assembly 50 may include: an ion optics 51 including at least one extractor and at least one einzel lens; a source assembly support 52 formed in a tubular shape and provided at a rear end of the ion optics 51 so as to be disposed on the same axis as the ion optics 51; a mounting plate 53 formed in a plate shape and disposed on the same axis as the source assembly support 52; a ground electric field shielding tube 54 formed in a tubular shape, and disposed on the same axis as the ion optics 51 while penetrating through the center of the mounting plate 53; and an ion gate 55 provided at a rear end of the ground electric field shielding tube 54, guiding the secondary ions collected by the ion optics 51 and flying while passing through the ground electric field shielding tube 54 to pass the secondary ions through the ion gate. The ion optics assembly 50 may further include a reflectron 57 supported by a reflectron support 56 provided in the mounting plate 53 and formed at a rear side of the ion gate 55 in a shape in which at least one ion mirror is multilayered.

The ion optics 51 may include an outer extractor 511 formed of a tubular body of which an inner portion is empty, having one side formed in a shape of a cone, and having a hole penetrating therethrough in an axial direction at an apex of the cone so that secondary ions pass therethrough, the apex of the cone being disposed to be adjacent to the sample, a first inner extractor 512 formed of a tubular body of which an inner portion is empty, having one side formed in a hemisphere shape, and having a hole penetrating therethrough in an axial direction at the center of the hemisphere so that secondary ions pass therethrough, a portion of the first inner extractor being inserted into an inner side of the outer extractor 511 and disposed on the same axis as the outer extractor 511; a second inner extractor 514 formed in a pillar shape, having a hole penetrating therethrough in an axis direction at the center so that the secondary ions are passed therethrough, disposed on the same axis as the first inner extractor 512, connected to the first inner extractor 512, and spaced apart from the outer extractor 511 by an insulating spacer 513; a first ground electrode 516 formed in a plate shape, having a hole formed at the center so that the secondary ions are passed therethrough and spaced apart on the same axis as a rear side of the second inner extractor 514 by an insulating spacer 515; an einzel lens 517 having a hole formed at the center so that the secondary ions are passed therethrough and spaced apart on the same axis as a rear side of the first ground electrode 516; and a second ground electrode 518 formed in a plate shape, having a hole formed at the center so that the secondary ions are passed therethrough and spaced apart on the same axis as a rear side of the einzel lens 517.

Advantageous Effects

With a time-of-flight (TOF) based mass microscope system for an ultra-high speed multi-mode mass analysis according to the present invention, the TOF based microscope mode measurement may be achieved to significantly increase a measuring speed (by 100 times or higher) as compared to the existing microprobe mode mass analysis equipment used in analyzing a sample surface. In addition, the wide range of mass analysis from the low molecular weight analysis such as the drugs/metabolome/lipids to the high molecular weight analysis such as genes/proteins present on the surface may be achieved by changing only the condition of lens in the samples such as biotissues/biochips/microarray.

Further, the following effects may be expected. Demand for medical diagnostic equipment capable of increasing objective, quantitative and accurate properties of the disease diagnosis through development of the multi-mode integrated diagnostic system per individual kits, kits for kinds of disease, and kits for various kinds of diagnosis will be increased, and in addition, novel measuring technology not enabled before may be developed by convergence and integration of BT-NT-IT technology and the ultra-high speed multi-mode molecular diagnosis may be achieved based on the development. Therefore, change in the research into from structure or shape of the biopsy tissue using fluorescent stain or Bio-SEM/TEM to the integrated mass imaging measurement connected with functions of various atoms and molecules may be achieved to create diagnostic tool capable of simultaneously connecting the structural change and the functional change. In particular, it seems that the gap between technologies from the inside and outside of the country in the mass analyzing equipment related technology is not large.

Therefore, the time-of-flight based mass microscope system for the ultra-high speed multi-mode mass analysis according to the present invention may be utilized to achieve the early stage diagnosis of diseases, the realization of personalized medicine, and the reduction in the new medicine screening cost, and to significantly increase the possibility of developing the biomarkers such as metabolome, lipids, and proteins, having a close relationship with the disease, thereby achieving a new drug discovery much more smoothly. That is, the time-of-flight based mass microscope system for the ultra-high speed multi-mode mass analysis according to the present invention may have significant effects in various views such as providing new clinical diagnostic environment and information, creating the medical diagnostic industry, and increasing life quality and global competitiveness.

DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

Figure 1:
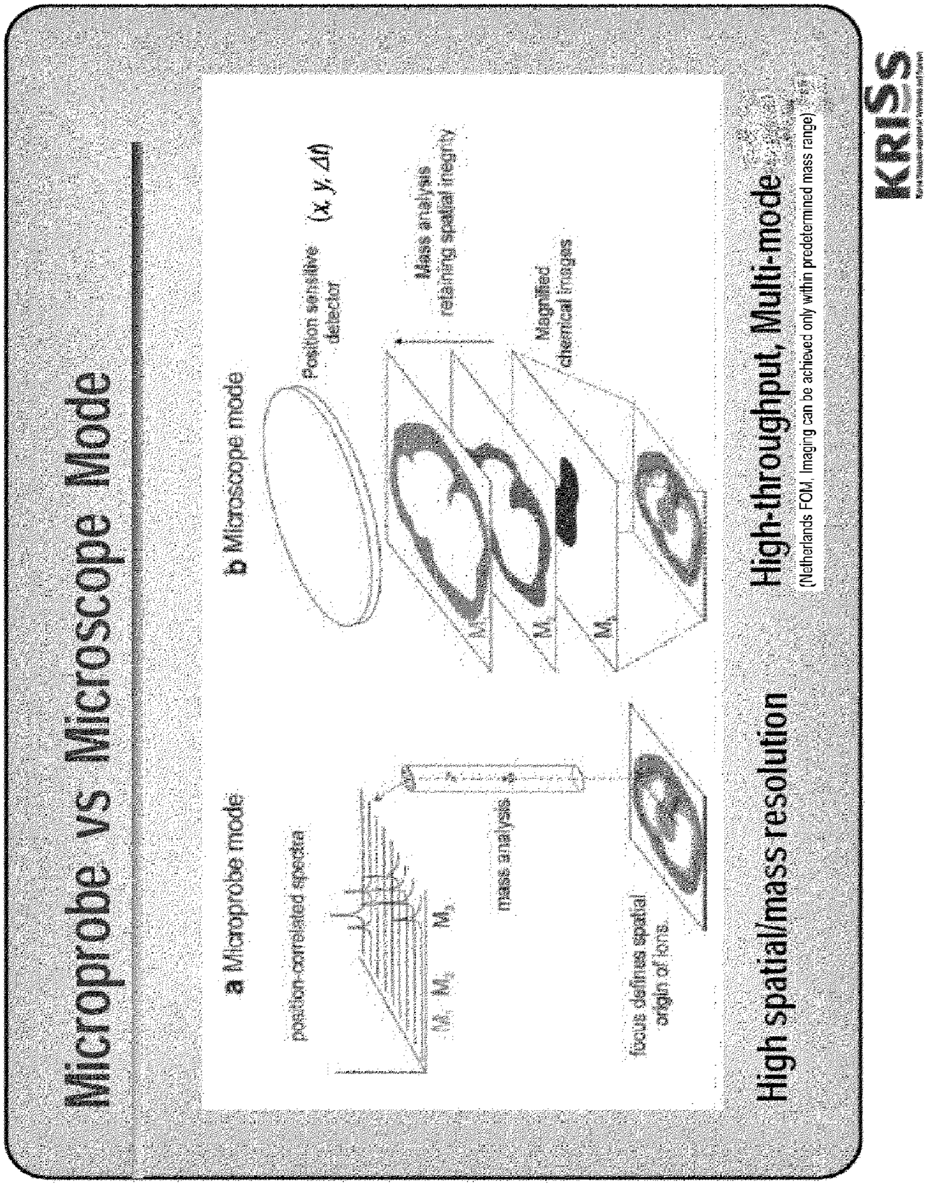
FIG. 1 shows differences between a microprobe mode and a microscope mode.

100: Mass Microscope System
110: laser input
120: ion gun assembly
130: sample inlet chamber
131: sample inlet part
140: sample plate
150: sample plate manipulator
160: charge-coupled device (CCD) camera
170: source lens assembly
180: linear mode position sensitive TOF detector
190: reflectron mode position sensitive TOF detector
50: ion optics assembly
51: ion optics
52: source assembly support
53: mounting plate
54: ground electric field shielding tube
55: ion gate
56: reflectron support
57: reflectron
511: outer extractor
512: first inner extractor
513: insulating spacer
514: second inner extractor
515: insulating spacer
516: first ground electrode
517: einzel lens
518: second ground electrode

BEST MODE

Hereinafter, a time-of-flight based mass microscope system 100 for ultra-high speed multi-mode mass analysis according to the present invention will be described in detail with reference to the accompanying drawings.

Figure 2:
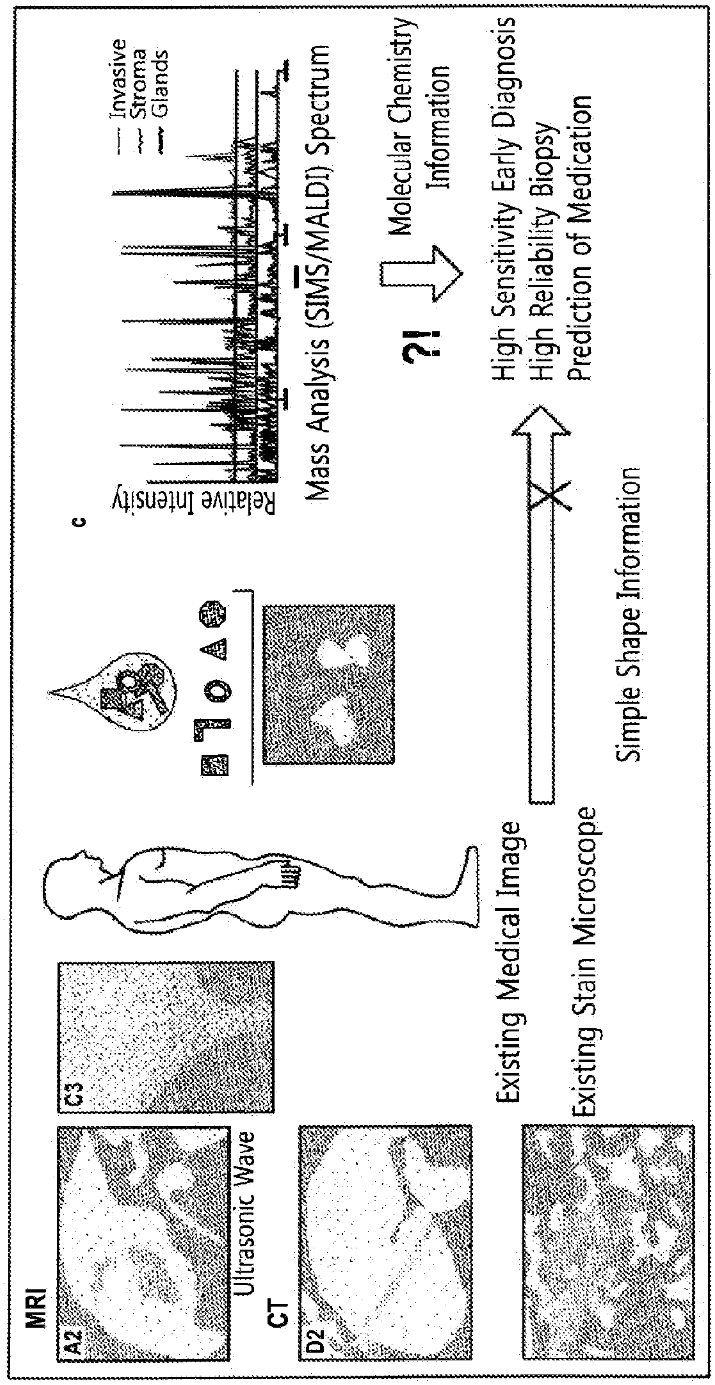
FIG. 2 shows differences between an existing diagnosis method and a mass chemistry analysis based diagnosis method.

FIG. 2 briefly explains differences between an existing diagnosis method and a mass chemistry analysis based diagnosis method. As shown in FIG. 2, a stain microscope used for the existing medical imaging is used to merely find simple shape information, thereby having difficulty in acquiring objective and quantitative information, such that diagnosis with the stain microscope tends to be largely dependent on subjective judgment. The mass microscope according to the present invention is capable of measuring mass, concentration, and distribution of various molecules included in biosamples (blood, cancer tissue biopsy, and the like), objectively and quantitatively finding disease information of human body and allowing a clinician to diagnosis the disease based on the above found information. Since the mass microscope according to the present invention is based on the chemical information through the mass of the molecules without depending on only existing shape information, the mass microscope may be useful for high sensitivity/early diagnosis/high reliability/monitoring of medication/prediction of medication, and the like. In particular, it is expected that the mass microscope according to the present invention may significantly contribute to the early diagnosis/screen, cancer tissue examination with accurate and high reliability, and prediction of medication, which are three assignments of cancer diagnosis/biopsy.

Figure 3:
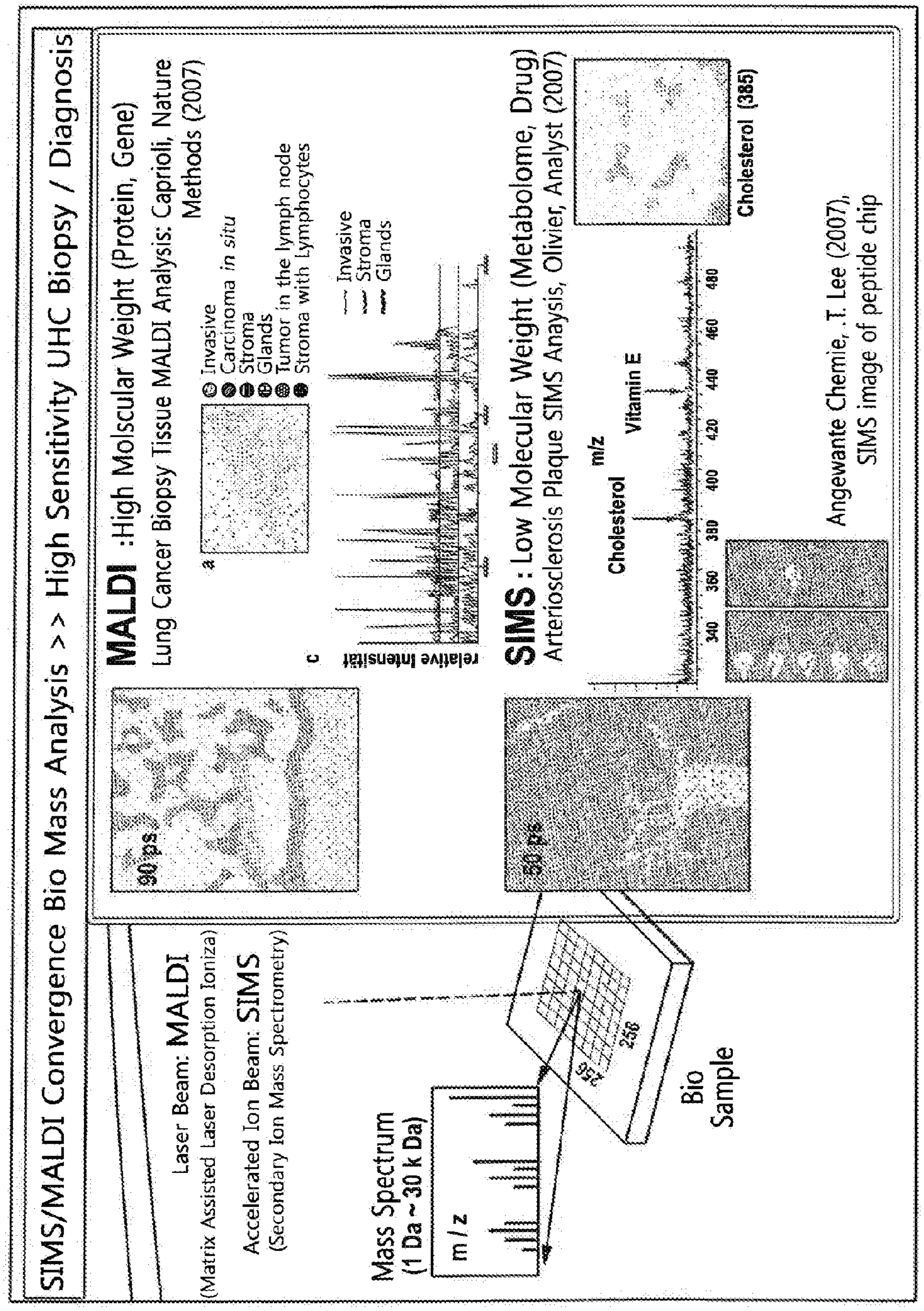
FIG. 3 explains molecular diagnostic measurement using a matrix-assisted laser desorption/ionization-time of flight (MALDI-TOF) mass spectrometry and a time-of-flight secondary ion mass spectroscopy (TOF-SIMS)

FIG. 3 is a view briefly explaining a molecular diagnostic measurement using a matrix-assisted laser desorption/ionization-time of flight (MALDI-TOF) mass spectrometry and a time-of-flight secondary ion mass spectroscopy (TOF-SIMS). It may be appreciated from FIG. 3 that since in the case of using a laser beam in any one sample, high molecular weight molecules diagnostic measurement using lipids, genes, and proteins may be achieved (MALDI-TOF), and in the case of using an accelerated ion beam with respect to the same sample, low molecular weight molecules diagnostic measurement using drugs, metabolome, and peptides may be achieved (TOF-SIMS), the SIMS and the MALDI may be converged to develop a multi-mode medical diagnostic equipment.

Figure 4:
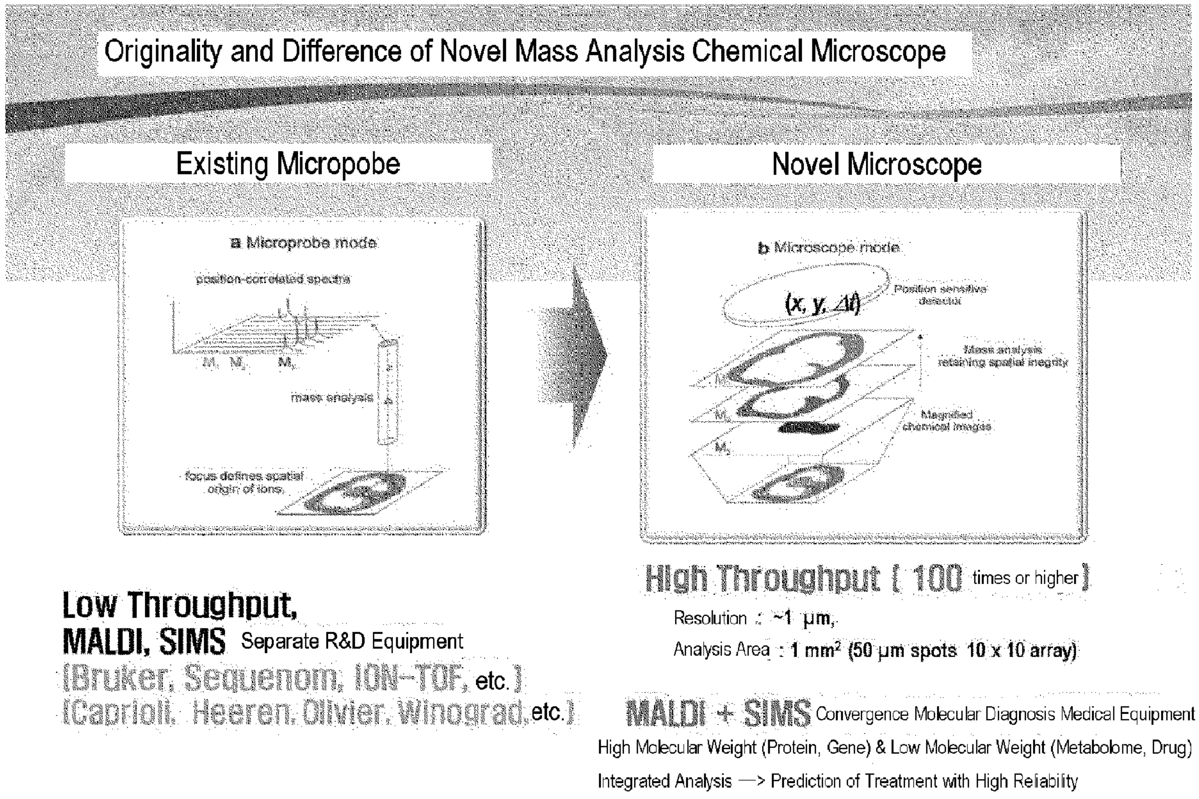
FIG. 4 shows differences between a mass analysis equipment (microscope mode) according to the present invention and an existing mass analysis equipment (microprobe mode)

FIG. 4 is a view explaining differences between a mass analysis equipment (microscope mode) according to the present invention and an existing mass analysis equipment (microprobe mode). In order to develop the MALDI/SIMS convergence multi-mode medical diagnostic equipment as described above, problems which are required to be solved are as follows. In the case of simply converging the MALDI scheme and the SIMS scheme, a measuring time is extremely long (low throughput) which causes difficulties in being used as a clinical medical equipment, wherein the basic reason is that a mode of scanning a surface of a biosample using a focused laser beam or an accelerated ion beam, that is, a microprobe mode is used in existing MALDI or SIMS. According to the present invention, the measuring time may be decreased to achieve high throughput as compared to existing equipment by introducing the scheme that scanning is not performed but photographing by a camera is performed, that is, a microscope mode into the equipment.

Figure 5:
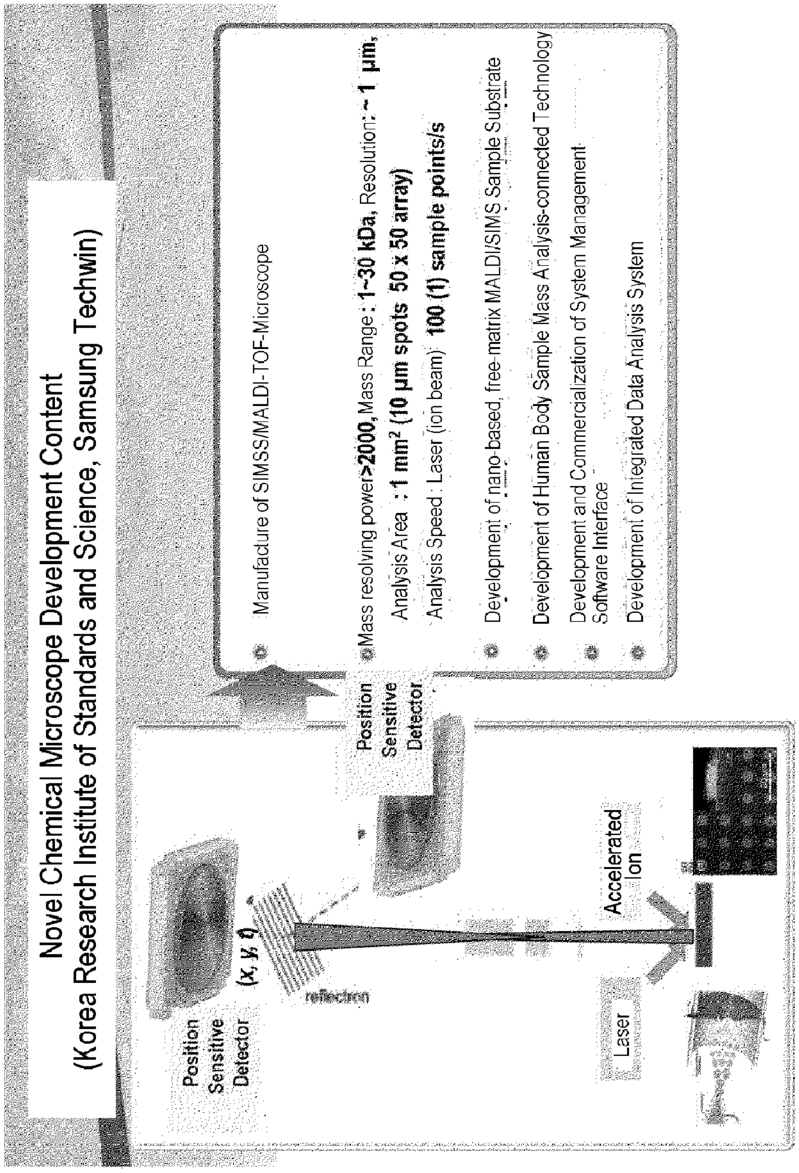
FIG. 5 explains basic principle and properties of a multi-mode (MALDI/SIMS convergence) mass chemistry microscope according to the present invention.

FIG. 5 explains basic principle and properties of a multi-mode (MALDI/SIMS convergence) mass chemistry microscope of the present invention. The mass microscope system of the present invention is a time-of-flight (TOF)-based mass chemistry microscope using a delay-line detector as a position sensitive TOF detector capable of simultaneously measuring a position (x, y) and a time-of-flight (t) of an ion signal to detect (x, y, t) and using a time to digital (A/D) converter based data processing technology and reflectron.

Here, a brief description of the TOF mass analysis method is as follows. In a matrix-assisted laser desorption/ionization-time of flight (MALDI-TOF) mass spectrometry, which is an analysis method in which the sample is added to a matrix absorbing UV to be crystallized and a mass of the sample is analyzed with a difference of the time-of-flight depending on m/z of ions produced by irradiating laser to be ionized, unlike GPC/SEC, absolute mass of polymer may be measured to be significantly useful for analyzing biopolymer such as proteins, or the like, synthetic polymer, and additive. The TOF mass analysis method may be largely classified into a linear scheme and a reflectron scheme, wherein the linear scheme is a scheme for passing all produced ions through a linear flight tube and the reflectron scheme is a scheme for attaching an ion mirror at a rear of the flight tube to increase resolution having a limited range.

Here, the mass microscope system of the present invention adopts a time-of-flight measuring type mass measuring scheme having a microscope mode introduced therein rather than a microprobe mode used in existing MALDI, and the like, such that mass and distribution of ions generated from the sample by using laser (MALDI-TOF) or ions generated from the sample by using the ion beam (TOF-SIMS) are capable of being measured. In particular, the sample may be irradiated and measured by defocusing the laser beam/ion beam so that field-of-view (FOV) is possible up to about 0.5×0.5 mm, such that in the case of bio tissue, the measurement may be achieved without moving a sample stage, and in a large area microarray or a microfluidics-interfaced sample plate, a high-throughput measurement may be achieved in a speed of at least 100 times or more by accurate control of the sample stage as compared to the measuring speed of the existing conventional equipment (1 sample/sec for MALDI-TOF, 0.01 sample/sec for TOF-SIMS). The present invention uses a simultaneous detector for time and position such as the delay-line detector (DLD) in both of the linear mode/reflectron mode (the following example describes that the delay-line detector is set as the simultaneous detector for time and position; however, it is apparent that any equipment rather than the DLD may be used in the present invention as long as the equipment is capable of simultaneously detecting time and position of secondary ions), such that high-throughput mass analysis and mass distribution imaging measurement may be achieved, and MS/MS using the reflector mode and post-source decay (PSD) may be achieved for identification of specific mass (m/z).

Hereinafter, a specific structure of the mass microscope system of the present invention will be described in detail.

Figure 6:
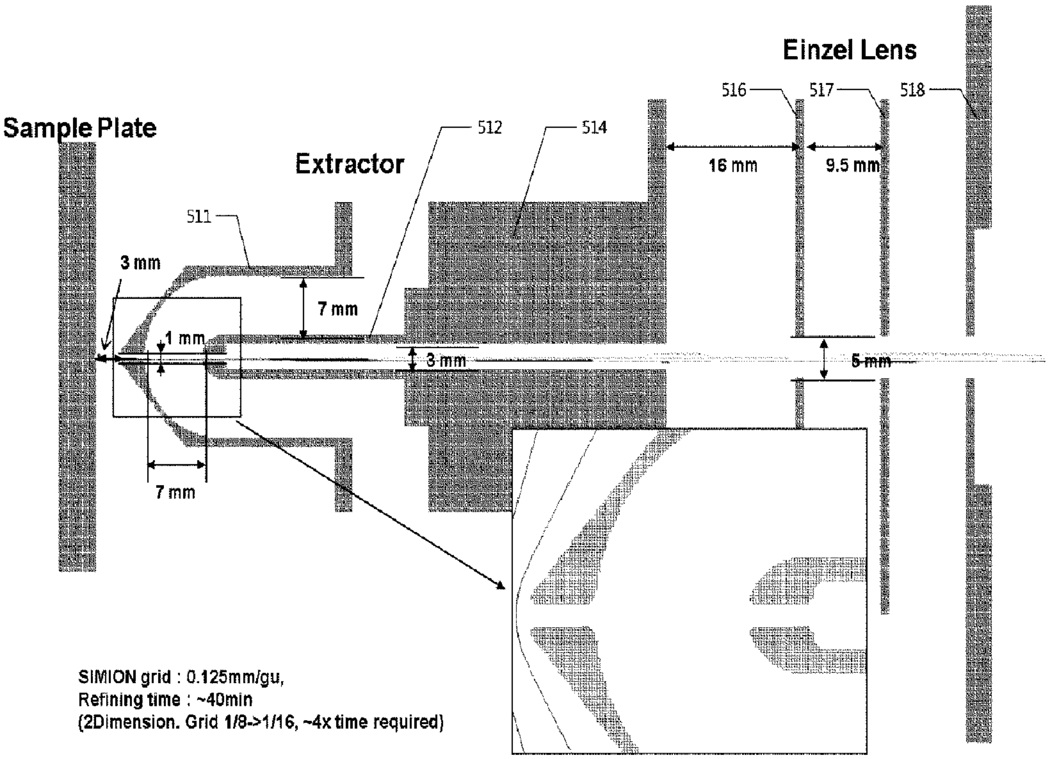
FIG. 6 is a cross-sectional view showing an ion optics of a multi-mode (MALDI/SIMS convergence) mass chemistry microscope according to the present invention.
Figure 7:
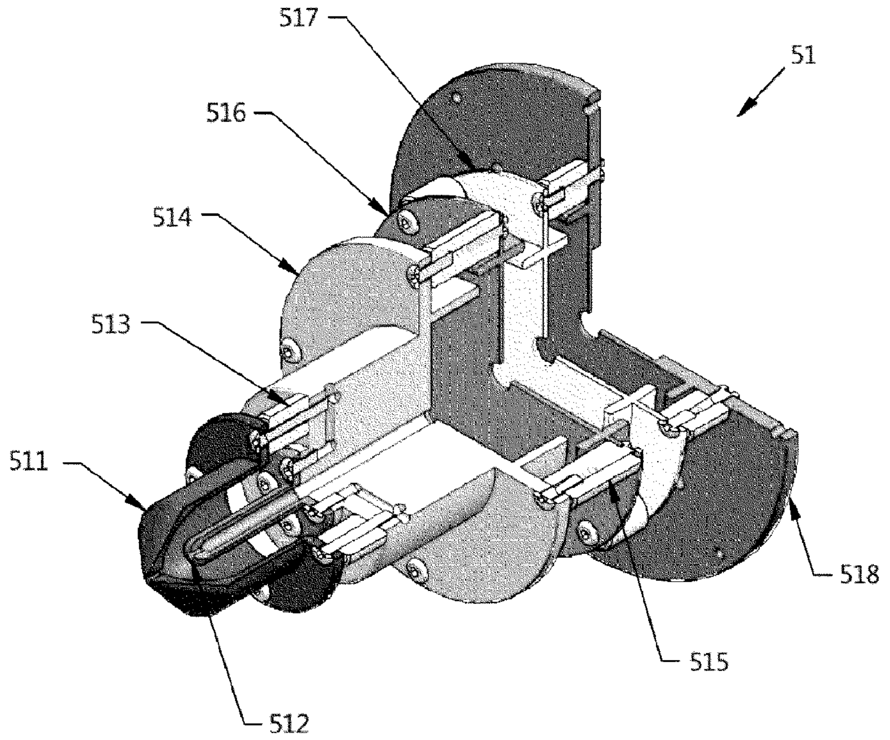
FIG. 7 is a perspective view showing the ion optics of the multi-mode (MALDI/SIMS convergence) mass chemistry microscope according to the present invention and indicating each part.

FIG. 6 is a cross-sectional view showing an ion optics of a multi-mode (MALDI/SIMS convergence) mass chemistry microscope according to the present invention, and FIG. 7 is a perspective view showing the ion optics of the multi-mode (MALDI/SIMS convergence) mass chemistry microscope according to the present invention. The ion optics including an extractor and an einzel lens is required to be appropriately designed and manufactured in order that the secondary ions generated from the sample by the defocused laser beam or the ion beam as described above are well extended and collected into a delay-line detector.

Figure 8:
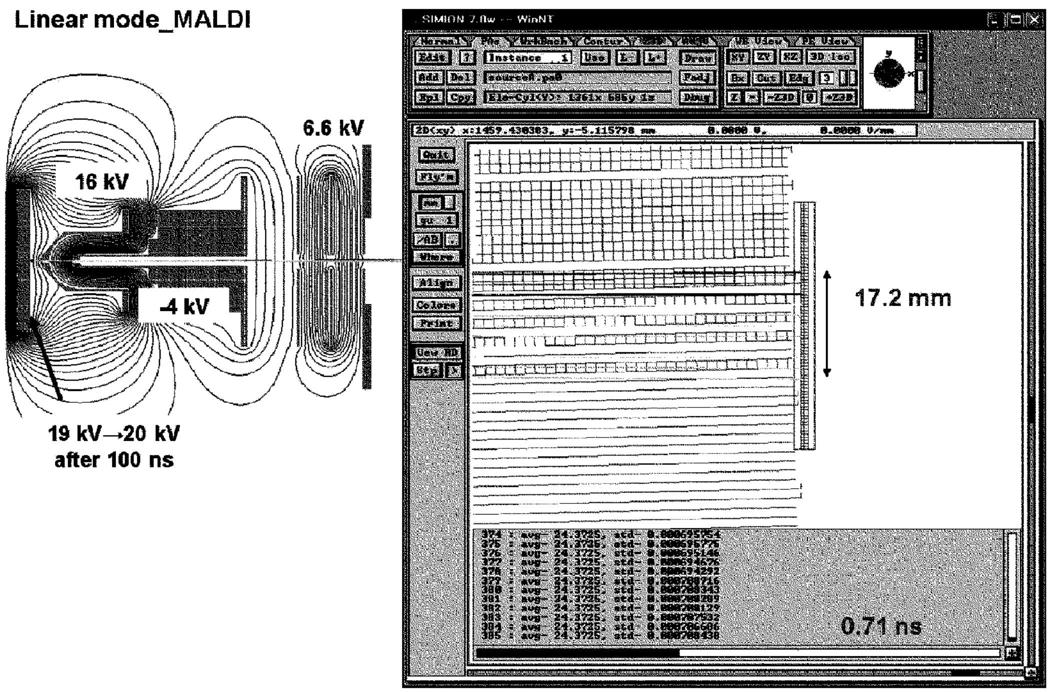
FIG. 8 shows voltage condition in a linear mode-MALDI and results obtained according to SIMION calculation of secondary ions.
Figure 9:
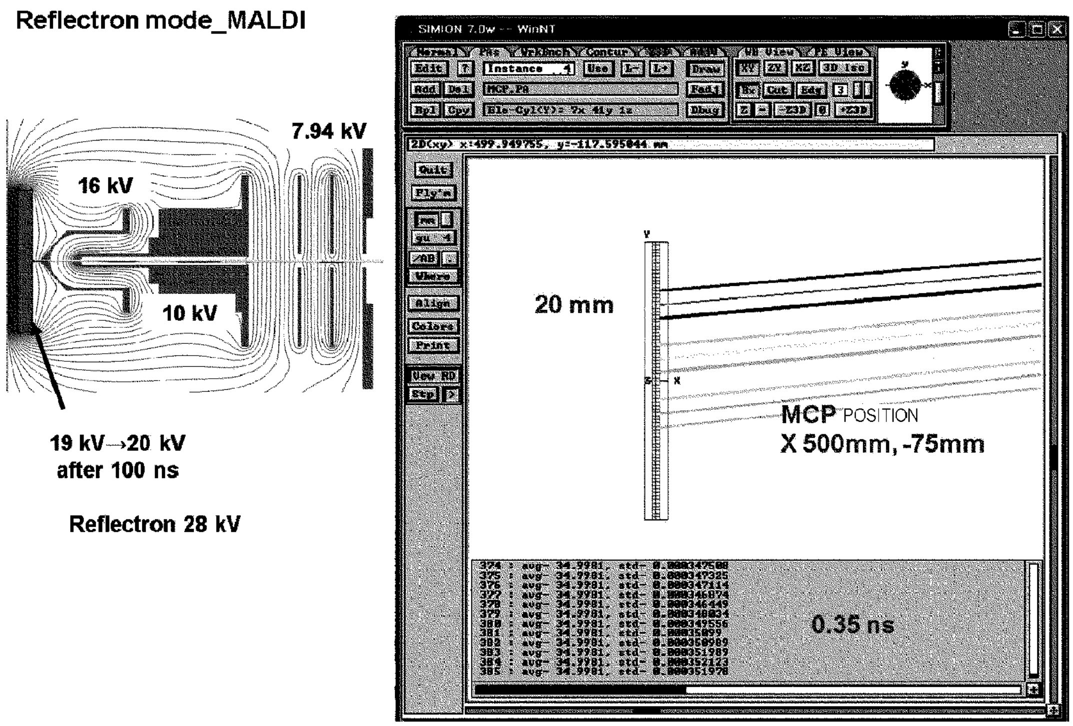
FIG. 9 shows voltage condition in a reflectron mode-MALDI and results obtained according to SIMION calculation of secondary ions.
Figure 10:
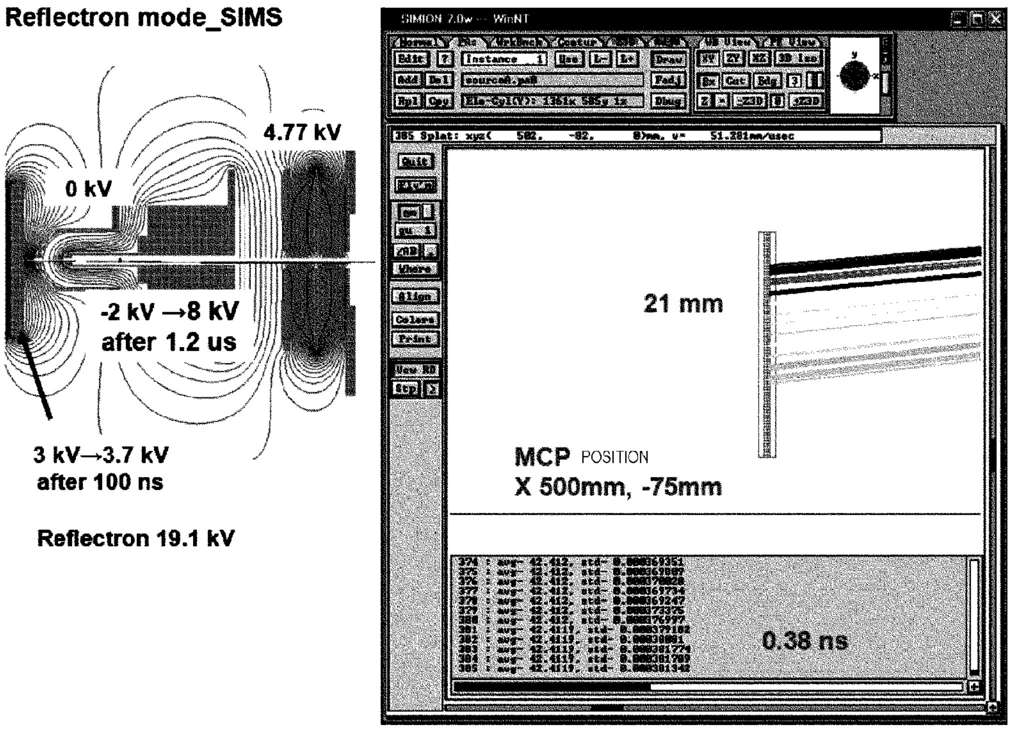
FIG. 10 shows voltage condition in a reflectron mode-SIMS and results obtained according to SIMION calculation of secondary ions.

The ion optics 51 is disposed to be adjacent to the sample plate having the sample, such that the secondary ions generated by irradiating the laser beam or the ion beam on the sample may be well extended and well collected into the detector. The ion optics 51 may include at least one extractor and at least one einzel lens as described above. In addition, in the present invention, SIMION which is an ion trajectory calculation method for finding optimum voltage condition is used, and FIG. 6 shows one example of specific structure and dimension of the sample plate/extractor/einzel lens used in the SIMION simulation. More specifically, at the time of designing the present invention, various initial displacement 11 condition (−0.25, −0.2, . . . , 0.25 mm), molecular weight m/z=1000, initial kinetic energy 5 condition (1, 2, 3, 4, 5 eV), initial angle 7 condition (−9, −6, −3, . . . , 9°), all 385 ions) of the secondary ions were used to obtain SIMION calculation results according to the voltage condition in the linear mode-MALDI (see FIG. 8), reflectron mode-MALDI (see FIG. 9), reflectron mode-SIMS (see FIG. 10), wherein condition in which the secondary ions generated from the sample were well focused on by an appropriate magnification (each 34.4 magnification, 40 magnification, 42 magnification) in the delay-line detector according to each position could be found, and based on this, the ion optics shown in FIGS. 6 and 7 were designed.

As shown in FIGS. 6 and 7, the ion optics 51 may include an outer extractor 511, a first inner extractor 512, an insulating spacer 513, a second inner extractor 514, an insulating spacer 515, a first ground electrode 516, an einzel lens 517, and a second ground electrode 518. Description of each part is as follows.

The outer extractor 511 is formed of a tubular body of which an inner portion is empty, having one side formed in a shape of a cone, and having a hole penetrating therethrough in an axial direction at an apex of the cone so that secondary ions pass therethrough, the apex of the cone being disposed to be adjacent to the sample.

The first inner extractor 512 is formed of a tubular body of which an inner portion is empty, has one side formed in a hemisphere shape, and has a hole penetrating therethrough in an axial direction at the center of the hemisphere so that secondary ions pass therethrough, a portion of the first inner extractor being inserted into an inner side of the outer extractor 511 and disposed on the same axis as the outer extractor 511.

The second inner extractor 514 is formed in a pillar shape, has a hole penetrating therethrough in an axis direction at the center so that the secondary ions are passed therethrough, is disposed on the same axis as the first inner extractor 512 and connected to the first inner extractor 512, and spaced apart from the outer extractor 511 by an insulating spacer 513.

The first ground electrode 516 is formed in a plate shape, has a hole formed at the center so that the secondary ions are passed therethrough and is spaced apart on the same axis as a rear side of the second inner extractor 514 by an insulating spacer 515.

The einzel lens 517 has a hole formed at the center so that the secondary ions are passed therethrough and is spaced apart on the same axis as a rear side of the first ground electrode 516.

The second ground electrode 518 is formed in a plate shape, has a hole formed at the center so that the secondary ions are passed therethrough and is spaced apart on the same axis as a rear side of the einzel lens 517.

That is, the ion optics 51 is disposed in a sequence of the outer extractor 511—the first inner extractor 512—the insulating spacer 513—the second inner extractor 514—the insulating spacer 515—the first ground electrode 516—the einzel lens 517—the second ground electrode 518 when being viewed from the sample.

The ion optics 51 having the above-described structure according to the present invention has the following features. First, the magnification of a phase may be controlled by adjusting voltage of the outer extractor 511 and the inner extractors 512 and 514. Second, the ground electrodes 516 and 518 are used to focus the phase onto the einzel lens 517. Third, the holes of the inner extractors 512 and 514 are formed in a long tubular shape, such that when ions pass through the hole, voltage may be increased to increase kinetic energy. Fourth, the ions are accelerated between the sample plate and the outer extractor 511, between the outer extractor 511 and the first inner extractor 512, and between the second inner extractor 514 and the first ground electrode 516.

Figure 11:
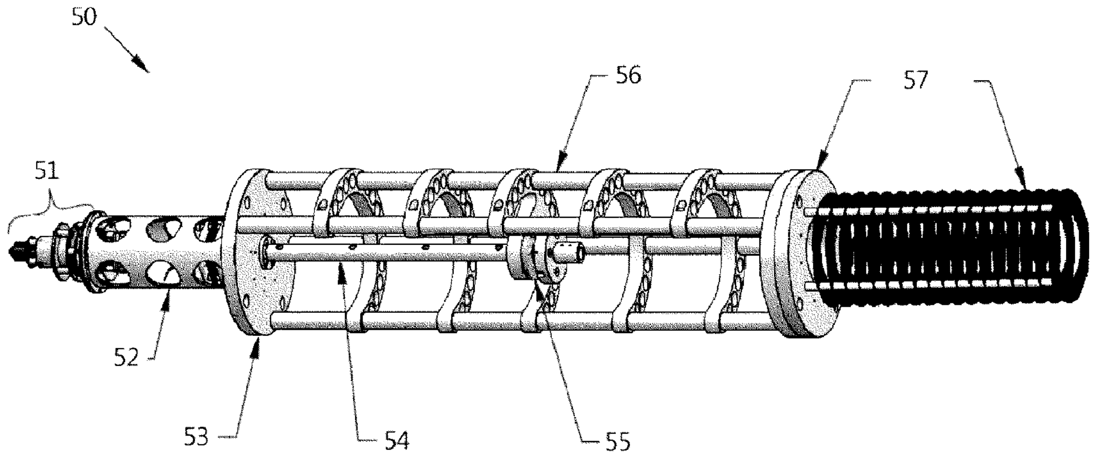
FIG. 11 is a perspective view showing an ion optics assembly having the ion optics and the reflectron coupled with each other of the multi-mode (MALDI/SIMS convergence) mass chemistry microscope according to the present invention and indicating each part.
Figure 12:
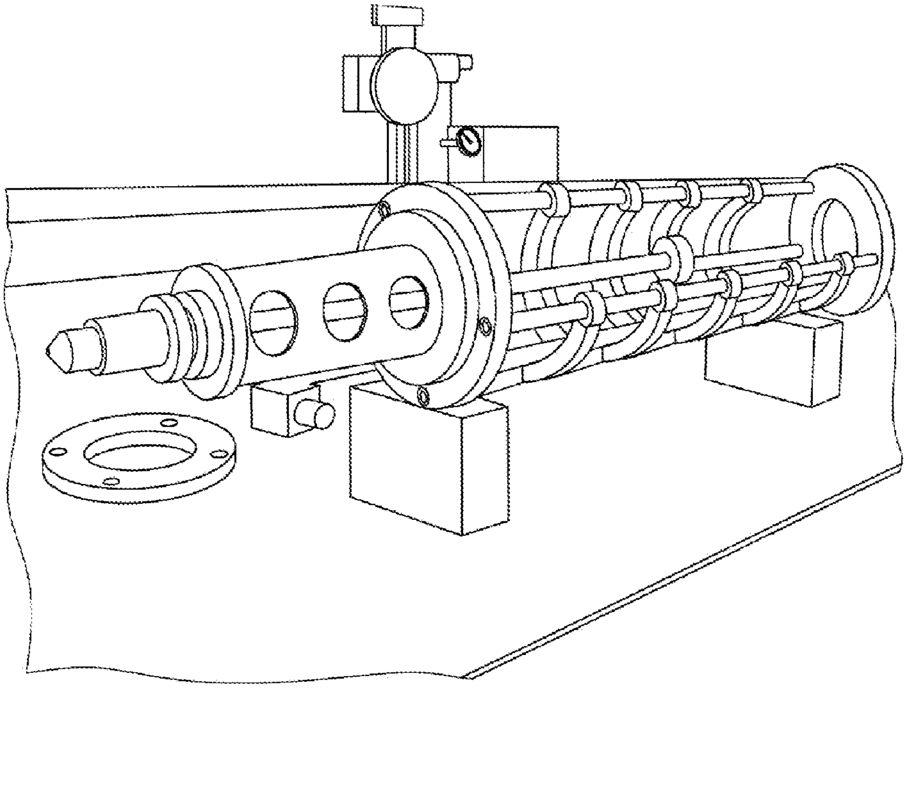
FIG. 12 is a photograph showing the actually manufactured ion optics assembly of the multi-mode (MALDI/SIMS convergence) mass chemistry microscope according to the present invention.

The ion optics 51 manufactured based on the SIMION ion trajectory calculation result depending on the voltage of the MALDI/SIMS secondary ions as described above is used to configure an ion optics assembly 50 performing the ion detection in the mass microscope system, that is, the multi-mode (MALDI/SIMS convergence) mass chemistry microscope according to the present invention as shown in FIG. 11. FIG. 12 is a photograph showing the actually manufactured ion optics assembly of the multi-mode (MALDI/SIMS convergence) mass chemistry microscope according to the present invention. Detailed description of each part is as follows with reference to FIG. 11.

The mass microscope system 100 of the present invention may include the ion optics assembly 50 collecting the secondary ions so that the secondary ions generated by the laser beam or the ion beam irradiated to the sample are smoothly detected. Here, the ion optics assembly 50 may include the ion optics 51 including at least one extractor and at least one einzel lens, wherein it is preferred that the ion optics 51 is made according to FIGS. 6 and 7, and the related-technology description; however, may be partially changed according to purpose or a design intention of users without departing the spirit of the present invention.

The ion optics assembly 50 may include: a source assembly support 52 formed in a tubular shape and provided at a rear end of the ion optics 51 so as to be disposed on the same axis as the ion optics 51; a mounting plate 53 formed in a plate shape and disposed on the same axis as the source assembly support 52; a ground electric field shielding tube 54 formed in a tubular shape, and disposed on the same axis as the ion optics 51 while penetrating through the center of the mounting plate 53; and an ion gate 55 provided at a rear end of the ground electric field shielding tube 54, guiding the secondary ions collected by the ion optics 51 and flying while passing through the ground electric field shielding tube 54 to pass the secondary ions through the ion gate, in addition to the ion optics 51.

Here, the ion optics assembly 50 having the only above-described structure is capable of merely measuring the position in the linear scheme. Here, the ion optics assembly 50 further includes a reflectron 57 supported by a reflectron support 56 provided in the mounting plate 53 and formed at a rear side of the ion gate 55 in a shape in which at least one ion mirror is multilayered, such that the position measurement of the ion may be achieved by the reflectron scheme as well as the linear scheme in the ion optics assembly 50.

The ion optics assembly 50 has the following features by having the above-described structure. First, the ion optics assembly 50 is designed so as to be combined in one assembly in order to well adjust phase diagram and concentricity of all lenses. Second, the ion optics assembly 50 is divided into a source part and a part supporting the reflectron based on the mounting plate 53 to have a stable structure. Third, the reflectron support 56 is preferred that a number of plates are coupled in the middle as shown in the drawings, and in the case in which the ion optics assembly is configured as described above, the stable structure may be formed so that the plates are not maximally distorted and the detector may be installed at the side of the ion optics assembly. Fourth, even though the detector is installed at the side of the ion optics assembly, the ground electric field shielding tube 54 may block electric field from the detector to prevent noise.

Figure 13:
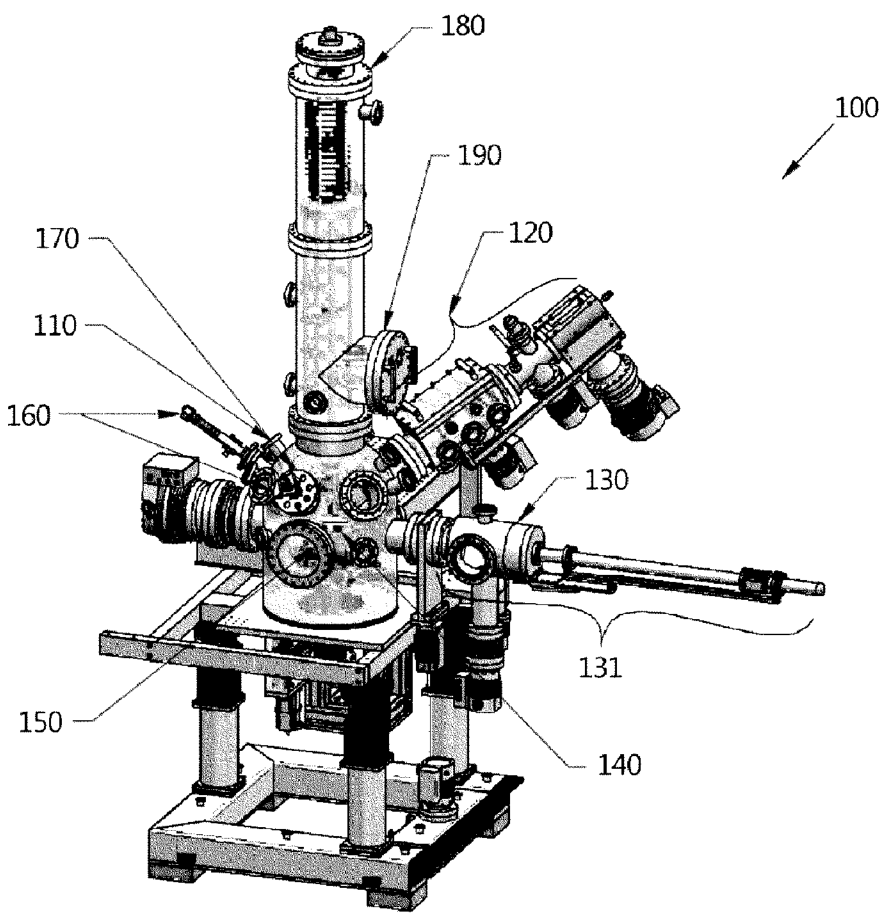
FIG. 13 shows a multi-mode (MALDI/SIMS convergence) mass chemistry microscope according to the present invention.
Figure 14:
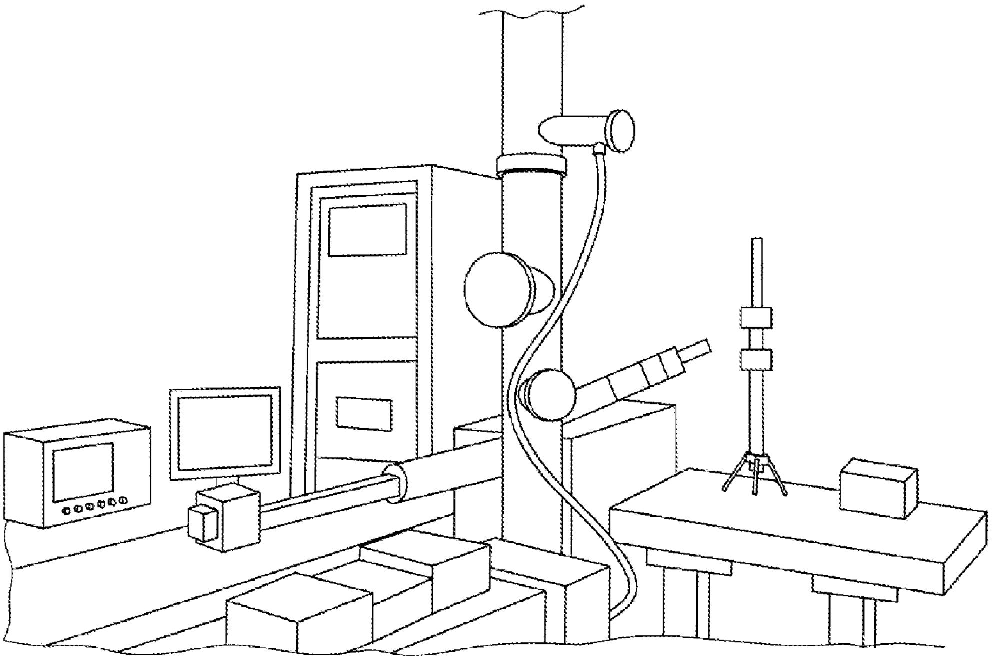
FIG. 14 is a photograph showing a multi-mode (MALDI/SIMS convergence) mass chemistry microscope according to the present invention.

FIG. 13 shows a multi-mode (MALDI/SIMS convergence) mass chemistry microscope, that is, the mass microscope system 100 according to the present invention. FIG. 14 is a photograph showing a multi-mode (MALDI/SIMS convergence) mass chemistry microscope according to the present invention.

The time-of-flight based mass microscope system for the ultra-high speed multi-mode mass analysis, the time-of-flight based mass microscope system 100 performing mass chemistry analysis of the sample performs a mass imaging analysis of the sample in the microscope mode by irradiating the laser beam, the ion beam, or any one of the laser beam and the ion beam in the defocused state on the sample, photographing the image of the sample, and simultaneously measuring and detecting the position of the secondary ion generated from the sample at the time of irradiating the laser beam or the ion beam, based on the time-of-flight (TOF), so as to perform the analysis with respect to all samples having from the low molecular weight sample to the high molecular weight sample. The prior arts have a problem in that the measuring time is extremely long due to the microprobe mode; however, according to the present invention, the measuring time may be significantly decreased by 100 times or more as compared to the prior art by irradiating a beam in a defocused state and using a photographing scheme rather than a scheme in which a sample is scanned by a pixel by pixel used in a microprobe mode. In addition, according to the present invention, the sample is irradiated by the laser beam only, the ion beam only, or both of the laser beam and the ion beam, and here, the method of measuring the position of the secondary ion in the microscope mode based on the time-of-flight is used, such that the measurement may be achieved in any samples having a wide range from high molecular weight samples such as genes/proteins/polymers, and the like, to low molecular weight samples such as drugs/metabolome/lipids/peptides, and the like, without having limitation in a molecular weight of the sample, thereby having significantly increased utility. Further, at the time of irradiating the laser beam, the MALDI-TOF scheme may be used to detect the position of the secondary ion, or at the time of irradiating the ion beam, the TOF-SIMS scheme may be used to detect the position of the secondary ion, and therefore, in the mass microscope system 100 according to the present invention, both of the matrix-assisted laser desorption/ionization-time of flight (MALDI-TOF) scheme and the time-of-flight secondary ion mass spectroscopy (TOF-SIMS) scheme may be converged to have significantly extended utilization range.

Specific structure of the mass microscope system 100 is described as follows. The mass microscope system 100 may include: a laser input 110 irradiating a laser beam on a sample; an ion gun assembly 120 irradiating an ion beam on a sample; a sample inlet chamber 130 into which the sample is input by a sample input part 131; a sample plate 140 in which the sample is disposed; a sample plate manipulator 150 controlling a position of the sample plate 140; a charge-coupled device (CCD) camera 160 photographing an image of the sample; a source lens assembly 170 controlling a focus of the laser beam or the ion beam irradiated to the sample; and a position sensitive time of-flight (TOF) detector measuring the position of the secondary ion generated from the sample. Here, the delay-line detector may be used for measuring the position of the secondary ion generated from the sample in the mass microscope system 100. In addition, it is preferred that the sample plate manipulator 150 is formed so that five axises of X, Y, Z, X-tilt, and Y-tilt are capable of being manipulated to maximally increase the degree of freedom.

Further, it is preferred in the mass microscope system 100 that the position sensitive TOF detector includes the ion optics assembly 50 described in FIGS. 11 and 12 and the related-description. Since the ion optics assembly 50 is designed so that the secondary ions generated from the sample irradiated by the laser beam or the ion beam are effectively collected and moved to the detector, the measurement may be effectively achieved as compared to the ion optics assembly 50 as shown in FIG. 11.

In addition, in the mass microscope system 100, both of the linear scheme and the reflectron scheme are used at the time of measuring the position of the secondary ions generated from the sample, such that the measurement may be significantly accurate. In order to achieve the present invention, more specifically, the ion optics assembly 50 include the reflectron and the detector is disposed in the side of the ion optics assembly, such that the position sensitive TOF detector may include a linear mode position sensitive TOF detector 180 measuring the position of the secondary ion generated from the sample in the linear scheme; and a reflectron mode position sensitive TOF detector 190 measuring the position of the secondary ion generated from the sample in the reflectron scheme as shown in the drawings.

The present invention is not limited to the above-mentioned embodiments but may be variously applied. In addition, it will be appreciated by those skilled in the art that various modifications and changes may be made without departing from the appended claims of the present invention.

INDUSTRIAL APPLICABILITY

According to the present invention, a measuring time may be significantly decreased by 100 times or more as compared to the prior art by irradiating a beam in a defocused state and using a photographing scheme rather than a scheme in which a sample is scanned by a pixel by pixel used in a microprobe mode. In addition, according to the present invention, the measurement may be achieved in any samples having a wide mass range from high molecular weight samples such as genes/proteins/polymers, and the like, to low molecular weight samples such as drugs/metabolome/lipids/peptides, and the like, without having limitation in a molecular weight of the sample, thereby having significantly increased utility. Further, according to the present invention, both of a matrix-assisted laser desorption/ionization-time of flight (MALDI-TOF) scheme and a time-of-flight secondary ion mass spectroscopy (TOF-SIMS) scheme may be converged to have significantly extended utilization range.

The invention claimed is:

1. A time-of-flight (TOF) based mass microscope system for an ultra-high speed multi-mode mass analysis, the time-of-flight based mass microscope system performing a mass imaging analysis of a sample in a microscope mode by irradiating a laser beam, an ion beam, or any one of the laser beam and the ion beam in a defocused state on the sample, photographing an image of the sample, and simultaneously measuring and detecting a position of a secondary ion generated from the sample at the time of irradiating the laser beam or the ion beam, based on a time-of-flight (TOF), so as to perform the analysis with respect to all samples having from a low molecular weight sample to a high molecular weight sample.

2. The time-of-flight based mass microscope system of claim 1, wherein the high molecular weight sample is at least any one selected from genes, proteins, and polymers.

3. The time-of-flight based mass microscope system of claim 1, wherein the low molecular weight sample is at least any one selected from drugs, metabolome, lipids, and peptides.

4. The time-of-flight based mass microscope system of claim 1, wherein the position of the secondary ion is detected by using a matrix-assisted laser desorption/ionization-time of flight (MALDI-TOF) scheme at the time of irradiating the laser beam.

5. The time-of-flight based mass microscope system of claim 1, wherein the position of the secondary ion is detected by using a time-of-flight secondary ion mass spectroscopy (TOF-SIMS) scheme at the time of irradiating the ion beam.

6. The time-of-flight based mass microscope system of claim 1, wherein a simultaneous detector for time and position including a delay-line detector is used in order to measure the position of the secondary ion generated from the sample.

7. The time-of-flight based mass microscope system of claim 1, wherein at the time of measuring the position of the secondary ion generated from the sample, both of a linear scheme and a reflectron scheme are used.

8. The time-of-flight based mass microscope system claim 1, wherein it includes:

a laser input irradiating a laser beam on a sample;

an ion gun assembly irradiating an ion beam on a sample;

a sample inlet chamber into which the sample is input by a sample input part;

a sample plate in which the sample is disposed;

a sample plate manipulator controlling a position of the sample plate;

a charge-coupled device (CCD) camera photographing an image of the sample;

a source lens assembly controlling a focus of the laser beam or the ion beam irradiated to the sample; and a position sensitive time of-flight (TOF) detector measuring the position of the secondary ion generated from the sample.

9. The time-of-flight based mass microscope system of claim 8, wherein the position sensitive TOF detector includes:

a linear mode position sensitive TOF detector measuring the position of the secondary ion generated from the sample in a linear scheme; and a reflectron mode position sensitive TOF detector measuring the position of the secondary ion generated from the sample in a reflectron scheme.

10. The time-of-flight based mass microscope system of claim 1, wherein it includes an ion optics assembly collecting the secondary ions so that the secondary ions generated by the laser beam or the ion beam irradiated to the sample are smoothly detected.

11. The time-of-flight based mass microscope system of claim 8, wherein the position sensitive TOF detector includes the ion optics assembly.

12. The time-of-flight based mass microscope system of claim 10, wherein the ion optics assembly includes:

an ion optics including at least one extractor and at least one einzel lens;

a source assembly support formed in a tubular shape and provided at a rear end of the ion optics so as to be disposed on the same axis as the ion optics;

a mounting plate formed in a plate shape and disposed on the same axis as the source assembly support;

a ground electric field shielding tube formed in a tubular shape, and disposed on the same axis as the ion optics while penetrating through the center of the mounting plate; and an ion gate provided at a rear end of the ground electric field shielding tube, guiding the secondary ions collected by the ion optics and flying while passing through the ground electric field shielding tube to pass the secondary ions through the ion gate.

13. The time-of-flight based mass microscope system of claim 12, wherein the ion optics assembly further includes a reflectron supported by a reflectron support provided in the mounting plate and formed at a rear side of the ion gate in a shape in which at least one ion mirror is multilayered.

14. The time-of-flight based mass microscope system of claim 12, wherein the ion optics includes:

an outer extractor formed of a tubular body of which an inner portion is empty, having one side formed in a shape of a cone, and having a hole penetrating therethrough in an axial direction at an apex of the cone so that secondary ions pass therethrough, the apex of the cone being disposed to be adjacent to the sample, a first inner extractor formed of a tubular body of which an inner portion is empty, having one side formed in a hemisphere shape, and having a hole penetrating therethrough in an axial direction at the center of the hemisphere so that secondary ions pass therethrough, a portion of the first inner extractor being inserted into an inner side of the outer extractor and disposed on the same axis as the outer extractor;

a second inner extractor formed in a pillar shape, having a hole penetrating therethrough in an axis direction at the center so that the secondary ions are passed therethrough, disposed on the same axis as the first inner extractor, connected to the first inner extractor, and spaced apart from the outer extractor by an insulating spacer;

a first ground electrode formed in a plate shape, having a hole formed at the center so that the secondary ions are passed therethrough and spaced apart on the same axis as a rear side of the second inner extractor by an insulating spacer;

an einzel lens having a hole formed at the center so that the secondary ions are passed therethrough and spaced apart on the same axis as a rear side of the first ground electrode; and a second ground electrode formed in a plate shape, having a hole formed at the center so that the secondary ions are passed therethrough and spaced apart on the same axis as a rear side of the einzel lens.

15. The time-of-flight based mass microscope system of claim 10, wherein the position sensitive TOF detector includes the ion optics assembly.

* * * * *